Nov. 11, 1969 G. E. AVERY 3,478,229

MULTIFUNCTION CIRCUIT DEVICE

Filed April 29, 1968 2 Sheets-Sheet 1

INVENTOR.
GEORGE E. AVERY

BY

Owen, Wickersham & Erickson
ATTORNEYS

MULTIFUNCTION CIRCUIT DEVICE

Filed April 29, 1968 2 Sheets-Sheet 2

INVENTOR.
GEORGE E. AVERY
BY
Owen, Wickersham & Erickson
ATTORNEYS

United States Patent Office 3,478,229

Patented Nov. 11, 1969

3,478,229

MULTIFUNCTION CIRCUIT DEVICE

George E. Avery, Sunnyvale, Calif., assignor to American Micro-Systems, Inc., Santa Clara, Calif., a corporation of California Filed Apr. 29, 1968, Ser. No. 724,827
Int. Cl. H03k 3/26, 19/08, 23/22
U.S. Cl. 307—303 6 Claims

ABSTRACT OF THE DISCLOSURE

A multifunction circuit device for use as a building block in electronic apparatus, comprising on a single integrated circuit chip, a first series of transistors each having drain, source and gate terminals. The source terminals for said first transistors are all connected to at least one external source bonding pad, and the drain terminals and the gate terminals for each of said transistors are connected to separate external bonding pads. A plurality of physically and electrically isolated inverter stages on the chip including a series of inverting transistors and a like number of load transistors. The drain terminals of the load transistors are connected to a common drain bonding pad and their gate terminals are similarly connected to a common gate bonding pad. The source terminals of the load transistors are connected with the drain terminals of the inverting transistors, which are also connected to separate bonding pads, and the source terminals of all the inverting transistors are connected to a common external source bonding pad. The bonding pads for the device are spaced apart along the sides of the chip.

This invention relates to a multipurpose circuit device incorporating semiconductor devices whose electronic function can be altered by varying the connection of its external inputs and outputs in a wide range of combinations.

Electronic apparatus of various types may utilize large numbers of different elements or subcircuits which are ultimately connected together to produce the desired operation. For developing such apparatus a need arose for a multipurpose or building block form of circuit which could satisfy a large number of separate circuit requirements and thereby greatly reduce the time and expense of developing certain complicated electronic apparatus. A general object of the present invention is to solve this problem by providing a multipurpose circuit device in the form of an integrated circuit chip utilizing metal oxide insulated gate devices.

A particular problem which was overcome in providing a multipurpose circuit in the form of an integrated circuit device was in providing the necessary internal circuit elements with the interconnecting conductive paths for producing the desired function and bonding pads for the internal elements having physical locations on the periphery of the device which provides a maximum of utility while being compatible with a wide range of other existing and commonly used electronic components.

In brief, the present invention provides a multipurpose circuit in the form of integrated semiconductor and lead circuit elements having bonding pads which can be connected in alternate arrangements to provide the desired function. The device in production has a first series of transistors all connected to one or more common source bonding pads, the drain and gate for each transistor being connected to a separate bonding pad. Adjacent to but physically and electrically isolated from the first transistors are a series of inverter stages utilizing MOS transistors connected to other bonding pads. The bonding pads are spaced apart along the four sides of the device which is rectangular in shape. The device may be utilized for a wide range of both digital and analog circuit functions, some examples being an expandable gate array and a five-channel multiplexor. Thus, my invention may be used in a great variety of equipment such as multiplexors, analog-digital converters, breadboard logic circuit and numerous other applications.

Yet another object of the present invention is to provide an integrated circuit device having metal oxide insulated gate devices capable of producing a variety of functions and which is particularly well adapted for ease and economy of manufacture.

Figure 1:
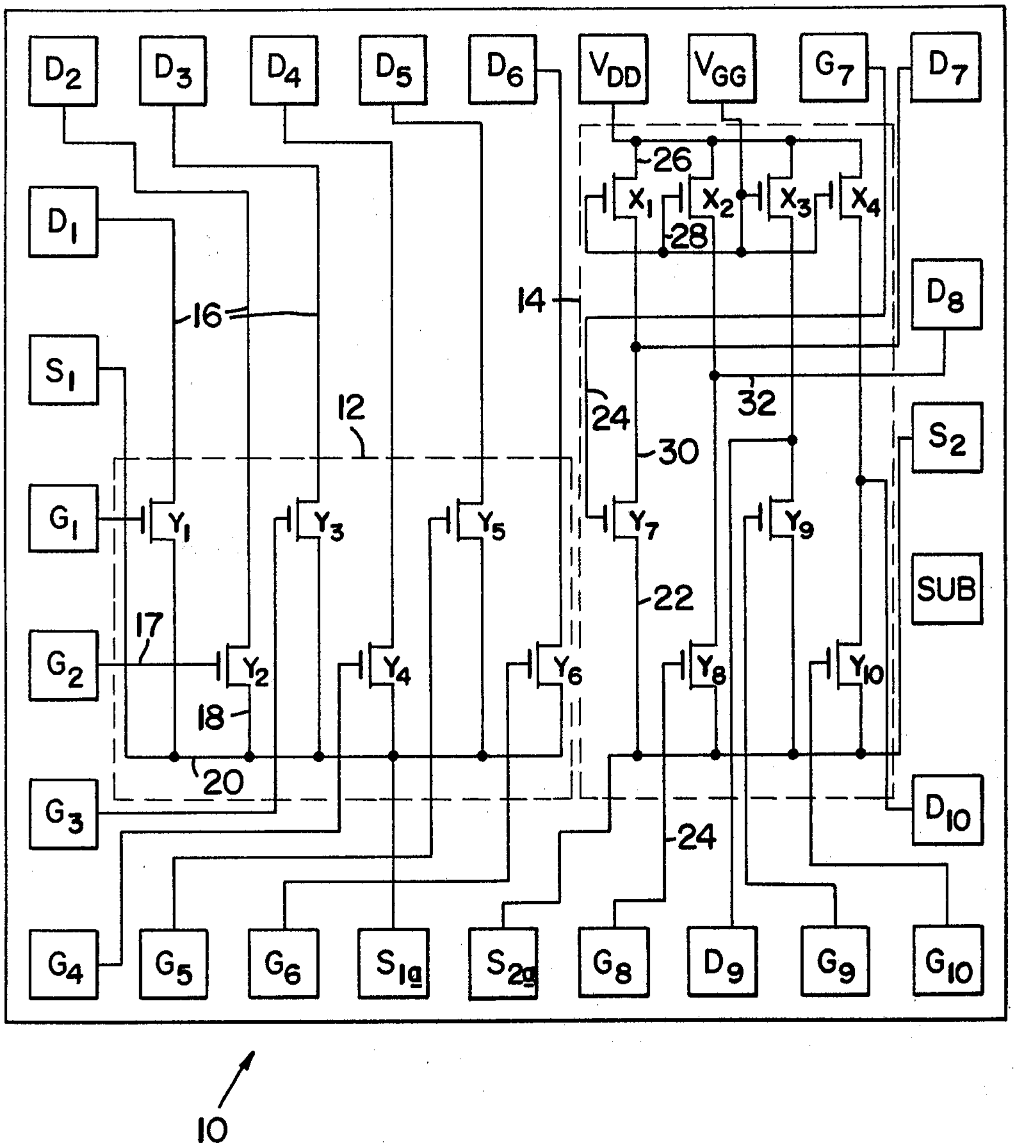
Figure 2:
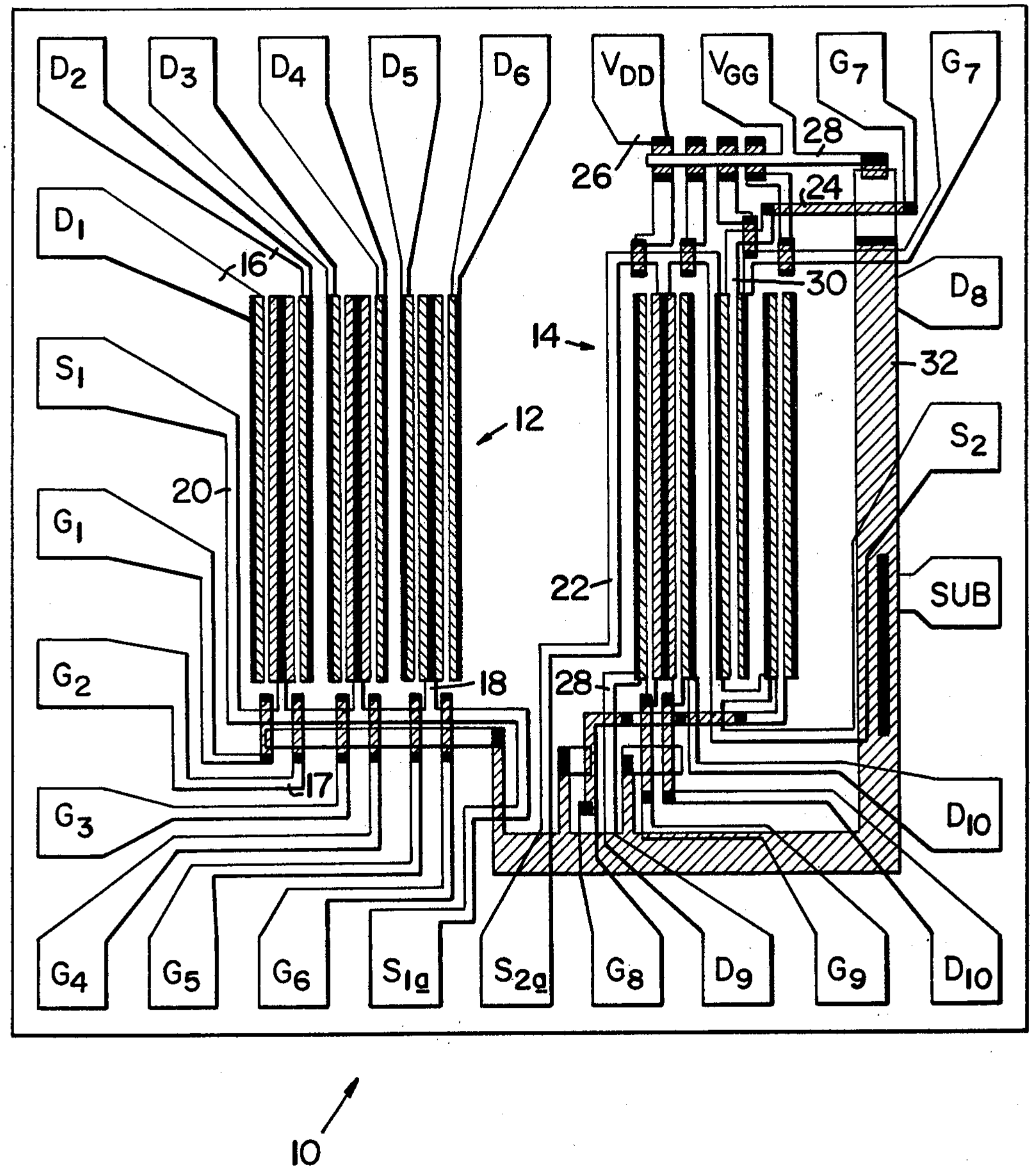

Other objects of advantages and features of the invention will become apparent from the following detailed description presented in conjunction with the accompanying drawings, in which:

FIG. 1 is a schematic diagram of the circuit according to the present invention; and FIG. 2 is a plan view of an integrated circuit device embodying the circuit of FIG. 1.

Referring to the drawing, FIG. 1 is a schematic diagram of a multipurpose circuit 10 embodying the principles of the present invention. In the embodiment shown, the circuit comprises two physically and electrically isolated component sections 12 and 14 which are formed as an integrated circuit device having a generally rectangular shape. The first section 12 comprises six transistors which are designated $Y_1$ through $Y_6$, respectively. Each of these six transistors has a separate drain terminal connected by a lead 16 to a bonding pad which is appropriately designated $D_1$ or $D_2$, etc. In addition, each of these transistors is connected to a separate bonding pad from its gate terminal by a lead 17, and these latter pads are designated $G_1$ to $G_6$. The source lead 18 on each transistor is connected to a common lead 20 which in turn is connected to a first source bonding pad $S_1$. A second alternate source bonding pad $S_{1a}$, provided for increased flexibility, is also connected to the lead 16 and thus to the six source leads 18. All of the six transistors ($Y_1$–$Y_6$) have identical electrical characteristics.

The second component section 14 for the circuit 10 provides four inverter stages comprised of an active or inverting transistor and a load transistor for each stage. The four inverting transistors are designoted $Y_7$ through $Y_{10}$, their source leads 22 being connected in parallel to a first source bonding pad $S_2$ and an alternate source bonding pad $S_{2a}$. The gates of these inverting transistors are connected by separate leads 24 to a series of bonding pads $G_7$ through $G_{10}$. Four load transistors are provided in combination with the inverting transistors to form the inverter stages. These four load transistors (designated $X_1$ to $X_4$) have drain leds 26 connected in parallel to a common drain bounding pad, which is designated $V_{DD}$ since it is used to furnish the external drain supply voltage. The gates of these load transistors are connected by leads 28 in parallel to a common bonding pad ($V_{GG}$) which is used to furnish the external gate supply voltage.

For each inverter stage, the source terminal of each load transistor is connected by a lead 30 to the drain terminal of an inverting transistor. Connected to each lead 30 is a branch lead 32 attached to a drain bonding pad. These latter bonding pads for the inverting transistor drains are designated $D_7$ to $D_{10}$.

All of the transistor gate inputs for the device are preferably provided with standard protection devices to prevent voltage overloading. Since such protection devices are conventional, they are not shown.

The circuit 10 and the elements thereof as described above with reference to FIG. 1, is shown in the enlarged plan view of FIG. 2 in the form of an integrated circuit device comprised of semiconductor elements, leads and bonding pads in a monolithic unit or chip. These various elements are arranged and located to provide not only maximum versatility for a wide range of applications, but the arrangement also makes it possible to manufacture the device efficiently and in quantity production using known integrated circuit techniques and to provide a device that is compatible for use in conjunction with other existing components. The chip is generally square with the bonding pads for the various gates, drains and sources being spaced apart and located along all four sides thereof and in a manner making it compatible with existing components as well as readily adaptable to other unorthodox connection arrangements.

The silicon substrate of the chip, its P and N regions and various conductive paths may be produced by known techniques using a three mask process. In accordance with the principles of my invention, the transistors $Y_1$ to $Y_{10}$ are formed from relatively elongated areas where oxide has been removed to facilitate a metal connection to a P-region (the solid areas) connected to adjacent P-regions of diffused boron (hatched areas) and the conductive paths of metal are denoted by double lines. By placing these transistor components in a parallel side-by-side array within the borders of the chip an efficient arrangement is provided. The transistor elements are made with relatively elongated P-regions, preferably greater than one-third the side length of the chip, thus offering a low resistance and facilitating operation with a high degree of efficiency. The transistors for the first section 12 ($Y_1$–$Y_6$) are located together nearer one side of the chip and are preferably spaced from the inverter transistors ($Y_7$–$Y_{10}$) of the second section 14. The load transistors ($X_1$–$X_4$) are located adjacent to and are connected with the appropriate inverting transistors. Since the construction of the chip may be in accordance with conventional procedures for making metal oxide semiconductor devices, the structure of the chip will not be described in detail. However, it should be noted that in the preferred construction, as shown, the body or substrate of the chip is N-type silicon bar, and it is covered with a metal oxide layer. The conductive paths or lines, the gates and the bonding pads are layers of metal on the oxide layer and are shown in FIG. 2 by outline lines. The hatched lines indicate underlying P-regions of the chip forming the various elements, and the solid black portions indicate where a layer of oxide has been removed, and the metal is bonded directly to a P-region. The substrate bonding pad designated "Sub" provides a direct connection to the substrate and thus a common ground connection to all of the internal elements of the chip.

In operation, different applications can be derived from this chip by bonding the appropriate pads to different package terminals. The following will illustrate some but by no means all of the possible applications.

To use the device as a single discrete transistor, either of the source ($S_1$) pads and any combination of drain and gate pads (e.g., $D_5$ and $G_5$) can be connected to appropriate terminals, the substrate pad being connected to a suitable ground.

If the device is used to operate as two separate transistors, the drain and gate pads of both transistors selected are connected separately to appropriate terminals, the source pads $S_1$ and $S_2$ for each selected transistor also being connected separately to the other sources. However, the device may also be used as two transistors in parallel if one source pad is connected to a common source input for two transistors whose drain and gate pads are connected to separate external terminals.

Further applications of the device may be described as follows:

(i) A single array of 10 transistors with a common source and separate drain and gate terminals;

(ii) An array of six transistors with a common source and separate drain and gate terminals;

(iii) Two sets of four transistors per set with each four transistor set having a common source terminal and separate drain and gate terminals;

(iv) Two sets of three transistors each with each set of three transistors having a common source terminal and separate drain and gate terminals;

(v) Two sets of two transistors each, each set of two transistors having a common source terminal and separate gate and drain terminals;

(vi) Two, three, four, five, six, seven, eight or nine transistors with a common source terminal and separate gate and drain terminals;

(vii) Four MOS inverting stages and four MOS transistors with the four separate MOS transistors having a common source terminal and separate gate and drain terminals with all input and output terminals as well as the common source terminals for the four MOS inverters being available externally on package pins; and (iii) Four MOS inverting stages with four MOS transistors, the four MOS transistors and the four MOS inverting stages having a common source terminal brought out to an external pin.

The list of applications for which my multiplexor expander circuit can be used is not intended to be a complete list. Further bonding applications can be obtained through the use of different bonding techniques and would provide other applications with this particular circuit.

The aforesaid applications vary from linear amplifier applications, multiplexor and commutator applications, to digital circuits with expansion capability and MOS to bipolar interface circuitry. This single circuit of the present invention covers the entire spectrum of potential applications avaliable to MOS circuitry today and can be used to implement all types of MOS digital circuit currently used. Thus, this one device through the use of multiplicity of bonding options is able to cover the entire spectrum of MOS applications.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A multifunction circuit for use as a building block in electronic apparatus, comprising:

a first series of transistors each having drain, source and gate terminals;

means connecting the source terminals for said transistors to at least one external source bonding pad;

means connecting the drain terminals of said transistors to separate external bonding pads;

means conecting the gate terminals of said transistors to separate external bonding pads;

a plurality of inverter stages including a second series of inverting transistors and a like number of load transistors;

means forming a common drain terminal for said load transistors;

means forming a common gate terminal for said load transistors;

means connecting the source terminal of each said load transistor with the drain terminal of one inverting transistor; and means connecting the source terminals of each said inverting transistor to a common external source bonding pad.

2. The circuit as described in claim 1 wherein said first series includes six transistors of identical electrical characteristics.

3. The circuit as described in claim 1 wherein said inverter stages are comprised of four inverting transistors and four load transistors.

4. The circuit as described in claim 1 wherein all of said transistors, said bonding pads and said connecting means are incorporated in a monolithic integrated circuit chip having a rectangular plan form, with said bonding pads arranged at spaced apart locations along all sides of the surface of said chip.

5. The integrated circuit chip as described in claim 2 wherein said first series of transistors are formed from elongated, parallel P-regions having a length greater than one-third the side length of said chip and grouped near one side thereon so as to be physically and electrically isolated from said inverter stages.

6. The integrated circuit chip as described in claim 5 wherein said inverting transistors are formed from P-regions which are spaced from but parallel to and of substantially the same length as the P-regions of said first series of transistors.

References Cited

UNITED STATES PATENTS

| | | | |
|---|---|---|---|
| 3,201,574 | 8/1965 | Szekely | 307—213 |
| 3,365,707 | 1/1968 | Mayhew | 317—235 |

JERRY D. CRAIG, Primary Examiner

U.S. Cl. X.R.

307—205, 213, 304; 317—235